(12) United States Patent
Khamesee et al.

(10) Patent No.: US 9,689,934 B2
(45) Date of Patent: Jun. 27, 2017

(54) METHOD FOR PROVIDING FORCE INFORMATION IN A MAGNETIC FIELD ENVIRONMENT USING REMOTE MEASUREMENT OF FLUX

(71) Applicants: Mir Behrad Khamesee, Waterloo (CA); Moein Mehrtash, Waterloo (CA)

(72) Inventors: Mir Behrad Khamesee, Waterloo (CA); Moein Mehrtash, Waterloo (CA)

(*) Notice: Subject to any disclaimer, the term of this patent is extended or adjusted under 35 U.S.C. 154(b) by 131 days.

(21) Appl. No.: 14/190,255

(22) Filed: Feb. 26, 2014

(65) Prior Publication Data

US 2014/0253114 A1 Sep. 11, 2014

Related U.S. Application Data

(60) Provisional application No. 61/850,902, filed on Feb. 26, 2013.

(51) Int. Cl.
 *G01R 33/02* (2006.01)
 *G01R 33/07* (2006.01)
 *G01R 33/038* (2006.01)

(52) U.S. Cl.
 CPC ......... *G01R 33/07* (2013.01); *G01R 33/0385* (2013.01); *G01R 33/072* (2013.01)

(58) Field of Classification Search
 CPC .... G01R 33/07; G01R 33/02; G01R 33/0385; G01R 33/072
 USPC ............ 324/251, 207.2, 207.21, 252, 207.25
 See application file for complete search history.

(56) References Cited

U.S. PATENT DOCUMENTS

| | | | | | |
|---|---|---|---|---|---|
| 5,168,183 | A | * | 12/1992 | Whitehead | H02N 15/00 104/284 |
| 6,605,941 | B2 | * | 8/2003 | Abe | B82Y 35/00 324/210 |
| 7,301,336 | B2 | * | 11/2007 | Endo | B82Y 25/00 324/202 |
| 8,536,862 | B2 | * | 9/2013 | Kimura | B82Y 35/00 324/244 |
| 2006/0152309 | A1 | * | 7/2006 | Mintchev | A61B 1/00158 335/58 |

OTHER PUBLICATIONS

Mehrtash, et al., "Bilateral macro—micro teleoperation using magnetic levitation", Mechatronics, IEEE/ASME Transactions on, 16(3):459-469, Jun. 2011.

Mehrtash, et al., "Motion control of a magnetically levitated microrobot using magnetic flux measurement", Microsystem Technologies, 18:1417-1424, Jun. 2012.

* cited by examiner

*Primary Examiner* — Jay Patidar
(74) *Attorney, Agent, or Firm* — Gowling WLG (Canada) LLP; Jeffrey W. Wong

(57) ABSTRACT

A method and system for determining a force experienced by an object of interest (OOI) within a magnetic field is disclosed. The method includes moving the OOI toward an expected position by altering the magnetic field and then calculating force information associated with the force experienced by the OOI. The force calculation based on a comparing the new position of the OOI vs the expected position of the OOI. The force calculations include magnetic flux measurements.

15 Claims, 16 Drawing Sheets

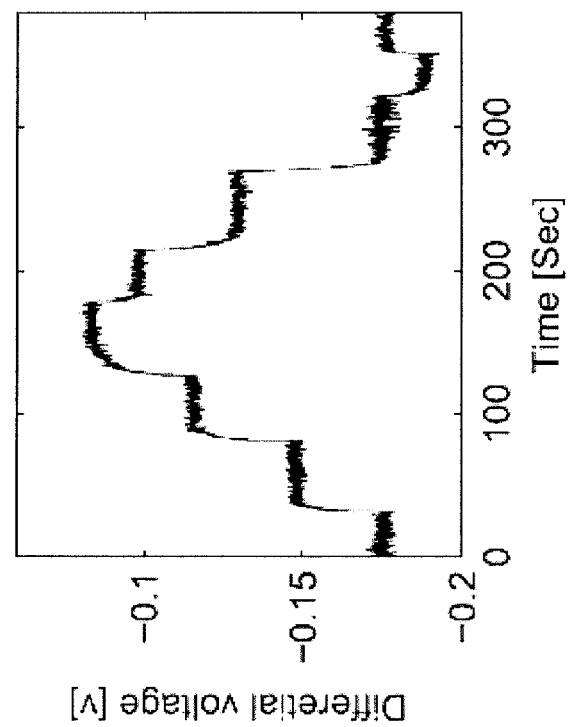
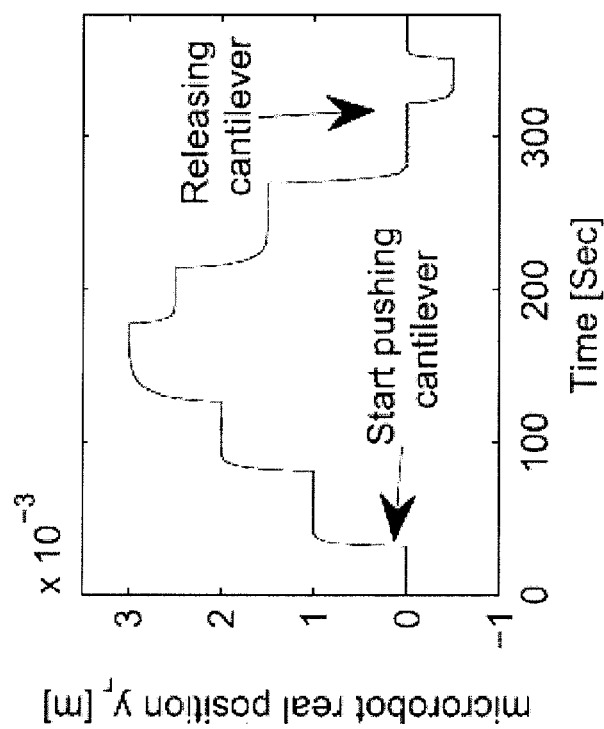
FIG. 12B
FIG. 12A

METHOD FOR PROVIDING FORCE INFORMATION IN A MAGNETIC FIELD ENVIRONMENT USING REMOTE MEASUREMENT OF FLUX

CROSS REFERENCE TO RELATED APPLICATIONS

This application claims the benefit of priority of U.S. Provisional Patent Application No. 61/850,902 filed Feb. 26, 2013, which is hereby incorporated by reference.

FIELD

The present disclosure relates generally to a magnetic levitation, magnetic actuation, and magnetic-based force sensing. More particularly, the present disclosure relates to a system and method for providing force information in a magnetic field environment.

BACKGROUND

Magnetically driven objects can be manipulated based on existence of an external magnetic field interacting with the magnetic field of the objects (with permanent magnets/ electromagnets on the objects). Magnetic propulsion is a magnetically driven system, (also known as magnetic suspension or maglev) generally involves the wireless transferring of the force and torque by means of magnetic repulsion or attraction. Often, the object is suspended without any additional support other than one or more magnetic fields.

One implementation of the magnetic propulsion principle is a magnetically navigated robot (magnetic robot). Magnetic robots typically use magnetic fields to cause an object to move and to have the object perform mechanical functions. Also, magnetic robots may not be levitated but be manipulated and moved by pulling or repealing using an external magnetic field.

For implementations of magnetic robots in which the object is sufficiently small, it is typically not possible to attach certain types of sensors to the object. Specifically, force sensors cannot generally be attached to sufficiently small objects even though force feedback may be advantageous for controlling and actuating the magnetic robot.

SUMMARY

It is an object of the present disclosure to obviate or mitigate at least one disadvantage of previous methods and apparatus to measure force in a magnetically driven environment.

In a first aspect, the present disclosure provides a method of providing force information experienced by an object of interest (OOI) in a magnetic field including sensing request for movement of the OOI within the magnetic field; and calculating the force information experienced by the OOI based on sensors associated with measuring the magnetic field.

In a further embodiment, there is provided apparatus for providing force information experienced by an object of interest (OOI) in a magnetic field including a processor; a measurement module for sensing characteristics of the magnetic field and for determining a new location and an expected position of the OOI; wherein the processor compares the new location and the expected position to determine the force information based on the sensed characteristics of the magnetic field.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIGS. 12A and 12B are charts illustrating position and voltage from force calibration.

DETAILED DESCRIPTION

Generally, the present disclosure provides a method and system for providing force information in a magnetically driven system, such as a magnetic propulsion, a magnetic repulsion or magnetic levitation (maglev) system. The disclosure is directed at a system which does not require the use of force sensors to be applied to objects within the magnetically driven system to obtain force information.

In one example, with the use of haptic feedback, the force information may be used to provide a tactile response for a user such as when the system is used in a medical procedure (navigating a medical capsule and/or surgical catheter). In this way, the user can gain a perceptible sense, in real-time, of the forces which are acting on an object. As such, the user can adjust operation of the magnetic robot in real-time without necessarily resorting to other output sources. In a specific example, the object may be a part to be inserted into a hole of a machine. If the part is not inserted correctly, it may come up against a wall of the hole. Without force feedback as described, a user would typically have to resort to rechecking visual cues or reading a position sensor in order to know if the part was inserted or was hitting a wall. With force feedback, the user may be alerted in real-time that the wall of the hole was providing a force against the motion of the part, and therefore, the user could adjust the motion of the part accordingly.

In use, the disclosure may be used in various applications that require contactless or untethered robot manipulation; for example, clean-room automation, biological applications, hazardous environment manipulation, wind tunnel testing, inside the human body for minimally invasive surgery and drug delivery, and autonomous manipulation.

Figure 1:
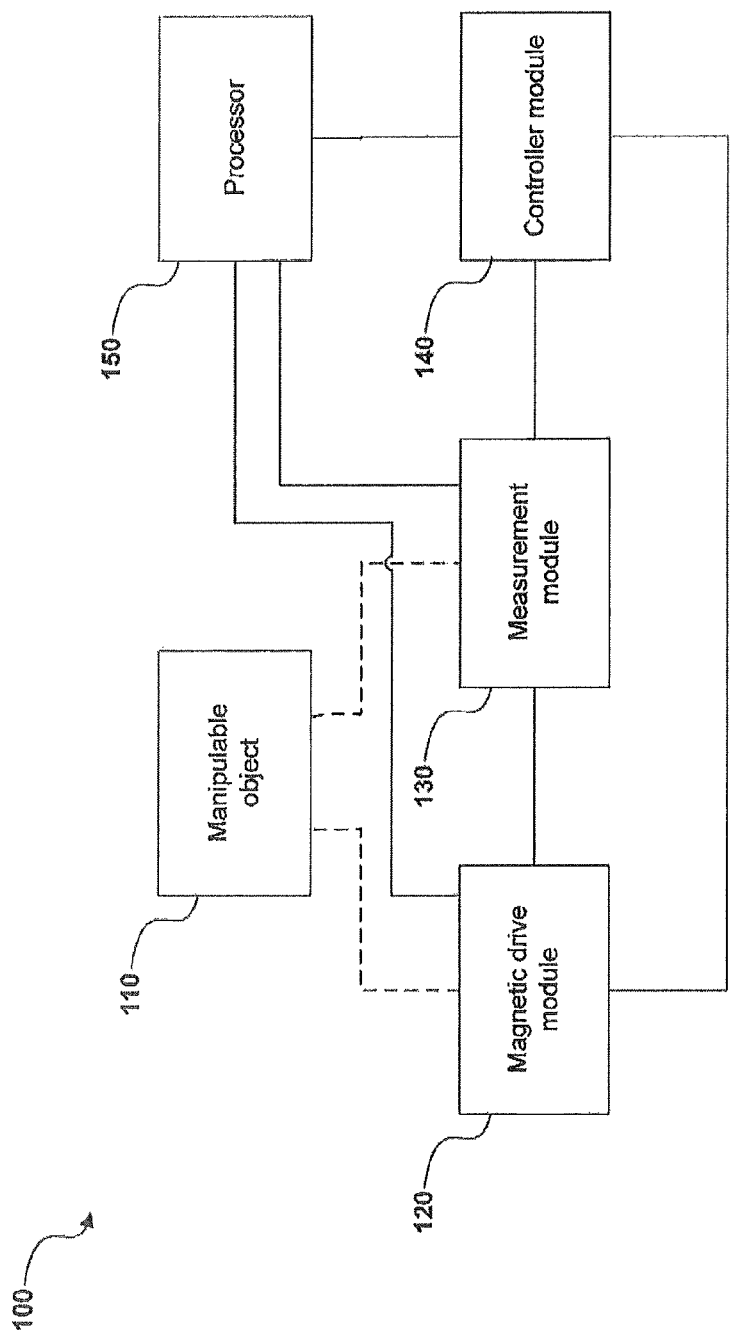
FIG. 1 illustrates a system for providing force information in a magnetic propulsion environment according to an embodiment.

Turning to FIG. 1, a schematic diagram of a system for providing force information is shown. The system 100 includes a manipulable object 110 or object of interest (OOI), a magnetic drive module 120, a measurement module 130 and a controller module 140.

The system 100 may include at least one processor 150 configured to execute the instructions of at least one of the modules 110, 120, 130 and 140. In some cases, each module may include a processor. In other cases, the system 100 may be a component within a server or network device (not shown), and the processor may be a central processing unit for the server or network device.

The system 100 allows for untethered control of manipulable object 110 within a magnetically driven field or magnetic drive module 120. The manipulable object 110 can be any object whose dimensions fit within the dimensions of an operable region of the magnetic drive module 120 and which can be acted on by a magnetic field; for example, a medical device, a catheter, a stent, a fastener, a tool, an actuator, a machine part, and the like.

The manipulable object 110 is preferably manufactured of a material that is capable of interacting with a magnetic field; for example an object containing ferromagnetic material, diamagnetic material, paramagnetic material, superconductors or electric coils. Additionally, the manipulable object 110 may be an object in which only a portion of the object is a material that interacts with a magnetic field.

Figure 2:
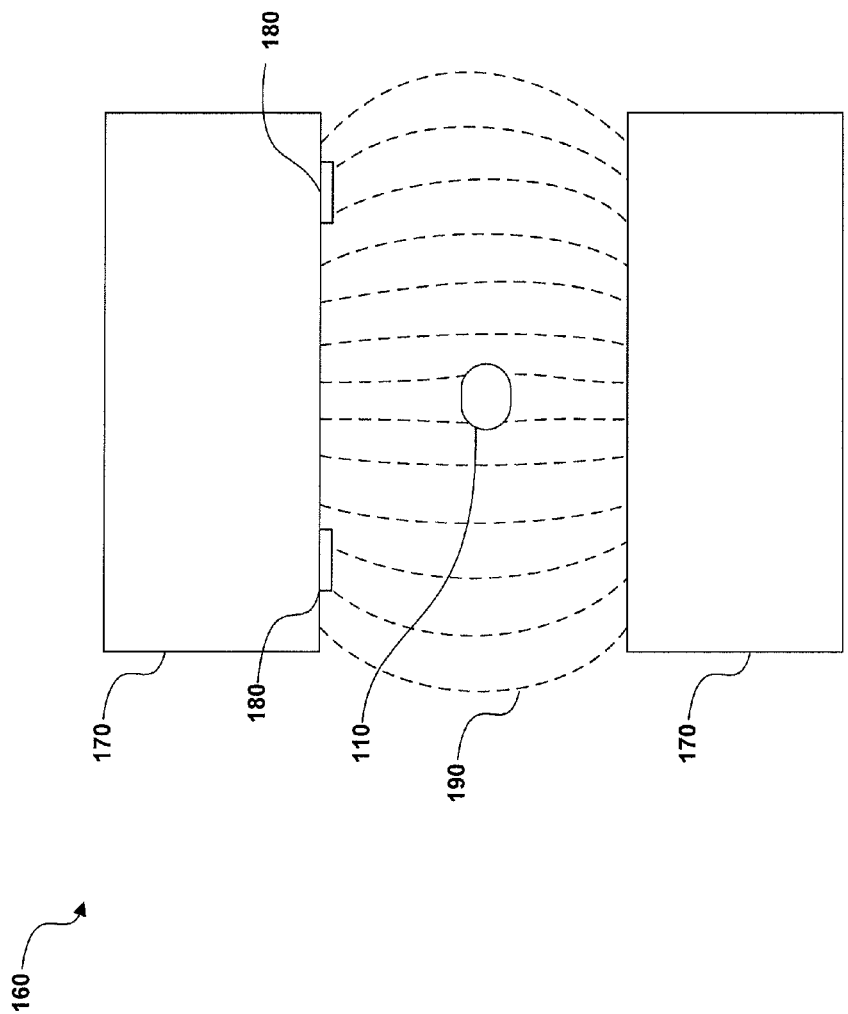
FIG. 2 illustrates a schematic side view of a manipulable object in a magnetically driven propulsion environment.

In one embodiment, the magnetic drive module may be a specific-designed or a customizable previously designed device that generate a controllable magnetically driven field for magnetic propulsion or repulsion purposes. The magnetic drive module 120 includes a magnetic field that interacts with the manipulable object 110 and generally includes at least a set of one or more controllable electromagnets. In one embodiment of the system 160 shown in FIG. 2, two sets of electromagnets 170 are disposed across from one another, with the manipulable object 110 situated within the magnetic field 190 in an operable region located between the two sets of electromagnets 170. Changes to the magnetic field 190 by the electromagnets 170 cause the manipulable object 110 to move within the magnetic field.

In operation, the magnetic drive module 120 keeps the manipulable object 110 in static equilibrium within the magnetic field until changes to the magnetic field are made. Additionally, the magnetic drive module 120 may apply a magnetic torque to the manipulable object 110 to induce a predetermined movement. The controller module 140 may control the forces and torques experienced by the manipulable object 110 by communicating with the magnetic drive module 120, or the electromagnets within the magnetic drive module, to alter the magnetic field.

The measurement module 130 measures the position of the manipulable object 110, preferably in real-time. If the manipulable object 110 changes position, the measurement module 130 can use this difference in position to calculate the force experienced by the manipulable object 110 if the manipulable object does not reach its expected position. This will be described in more detail below.

Traditional methods for measuring force use, for example, atomic force microscopes, microscales, piezoresistive cantilevers and capacitive force sensors. However, attaching such measurement devices to a sufficiently small manipulable object 110 may not be practical due to the relative size of these measurement devices (or sensors) with respect to the manipulable object 110. Also, these devices tend to be expensive and very sensitive to the physical parameters of an environment and therefor may not provide the accuracy necessary for specific applications. Therefore, an advantage of the system 100 is that force measurements may be obtained or calculated which do not require the assistance of force sensors mounted to the manipulable object 110. In a preferred embodiment, the measurement module 130 performs a non-contact force measurement through the use of position measurements and magnetic flux measurements.

In one embodiment, the measurement module 130 includes sensors capable of measuring magnetic flux, such as, but not limited to, Hall-effect sensors, however; these sensors are preferably integrated with the magnetic drive module 120 and not mounted to the manipulable object 110. In another embodiment, at least one sensor may be mounted to the manipulable object 110. In the system of 160 of FIG. 2, sensors 180 are shown mounted to the electromagnets 170. In a three-dimensional system, a minimum of six magnetic flux sensors are positioned around the system and oriented such that there are a minimum of two magnetic flux or Hall effect sensors per coordinate axis. The measurement module 130 may determine the characteristics of the magnetic field by measuring any of the voltage, current and power of each of the controllable electromagnets in the magnetic drive module 120. Using the obtained characteristics of the magnetic field, the magnetic flux sensors of the measurement module 130 may be further repositioned and reoriented to provide optimal coverage of the magnetic field.

The measurement module 130 measures the position of the manipulable object 110 using any suitable position measurement apparatus known in the art; for example, laser micrometers, optical micrometers, infrared micrometers, fiber optic sensors, capacitance sensors, x-ray radiography, sonar, ultrasound, magnetic resonance imaging, thermography, computed tomography, and the like. The measurement module 130 may also communicate a position and calculated force of the manipulable object 110 to the controller module 140.

In one embodiment, the controller module 140 may be connected to an input device (not shown). The input device can be any device that is suitable to manipulate the manipulable object 110; for example, a computer input device, a joystick, a remote, an optical tracker, a microphone, a motion sensor, a touchscreen, and the like. In a further case, the input device may have a feedback mechanism (not shown) such that the controller module 140 may communicate the calculated force experienced by the manipulable object 110. The feedback mechanism may be, for example, haptic feedback, an auditory response, a visual response, and the like. The input device allows for the untethered control of the manipulable object when the object 110 needs to be moved within the magnetic field.

Figure 3:
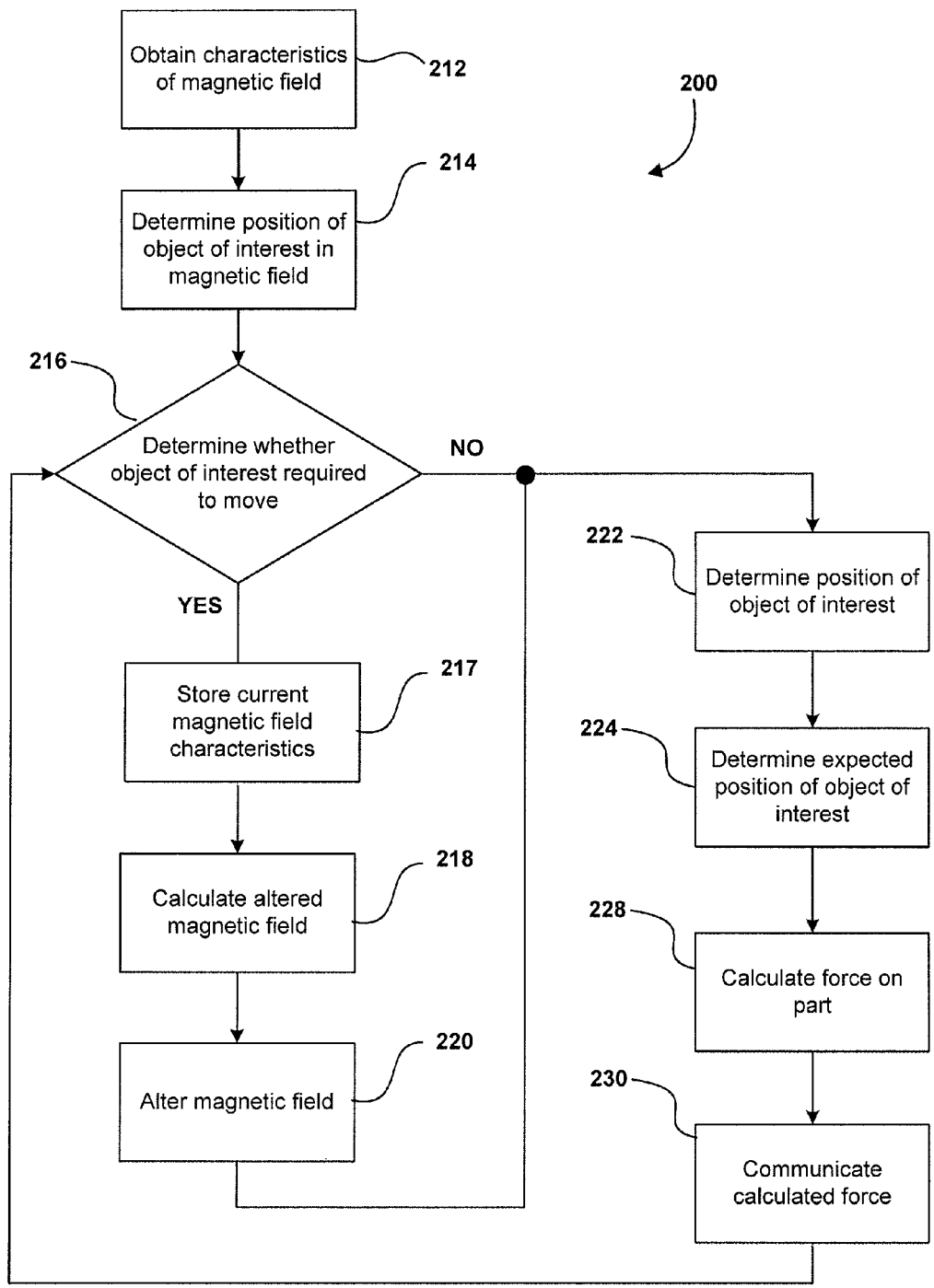
FIG. 3 is a flow chart illustrating a method for providing force information in a magnetically driven environment according to an embodiment.

Turning to FIG. 3, a flowchart illustrating a method for providing force information in a magnetically driven system is shown. As will be understood, the magnetic driven system (which may also be seen as the magnetic drive module)

includes a magnetic field which is implemented using a set of electromagnets placed at various locations within a housing. A set of magnetic field characteristic sensing sensors or magnetic flux sensing sensors, such as Hall-Effect sensors (seen as the measurement module 130) are also included within the housing in order to assist in obtaining measurements and data with respect to the characteristics magnetic field and objects within the magnetic field.

In order to calibrate the magnetically driven system so that force information may be more accurately collected, the characteristics of the magnetic field being used in the magnetically driven system are obtained 212. The characteristics may include, but are not limited to, the measured flux of the magnetic field and the power, current and voltage of the electromagnets. In one embodiment, the measurement module 130 measures the characteristics of magnetic field using sensors capable of measuring magnetic flux, such as the Hall-effect sensors. Although different orientations of the Hall-Effect sensors within the magnetic field may be considered, the sensors are typically oriented such that there are a minimum of two magnetic flux sensors per coordinate axis. In a further embodiment, obtaining characteristics of the magnetic field 212 may include obtaining the optimal position of the magnetic flux sensors based on the measured magnetic field which may be determined by a series of measurements and calculations. In another embodiment, the magnetically driven system characteristics are obtained directly from a manufacturer with Hall Effect sensors already integrated within so that the characteristics may be obtained from a data sheet and then stored into a processor without the need for the calibration to be performed. Within this calibration, whether measured or obtained from the manufacturer, an important value of the calibrated magnetic force relation is K which represents the magnetic force stiffness of the produced magnetic field.

In operation, the initial location of the manipulable object or an object of interest (OOI) 110 within the magnetic field created by the magnetically driven system is determined 214. In one embodiment, the OOI may be placed in a known location, such as a starting location, or the position may be obtained using known position determination techniques such as, but not limited to, laser micrometers, optical micrometers, infrared micrometers, fiber optic sensors, capacitance sensors, x-ray radiography, sonar, ultrasound, and magnetic resonance imaging. In one embodiment, the measurement module 130 may measure the position of the OOI. In some cases, the measurement module 130 may repeatedly perform real-time measurements of the position of the OOI.

After determining the location of the OOI, the system waits for an indication that the OOI is to be moved. In other words, there is a determination if the OOI is to moved 216.

In some cases, the indication that the OOI is to be moved may be received from the input device. As discussed above, the input device can be any device that is suitable to provide manipulation commands for the OOI; for example, a computer input device, a joystick, a remote, an optical tracker, a microphone, a motion sensor, a touchscreen, and the like.

Once the signal to move the OOI is sensed, the characteristics of the magnetic field are collected and stored 217 before the OOI moves. In one embodiment, the characteristics that are retrieved may include the strength of the magnetic flux within the magnetic field, or the strength of the electromagnets creating the magnetic field or the location of a minimal potential energy location within the magnetic field. In another embodiment, these characteristics may be previously stored and therefore, there may not be a need to obtain and store these measurements.

After storing these characteristics, the magnetic field that is required to move the OOI in response to the input device is calculated 218. In one embodiment, the magnetic drive module 120 calculates the magnetic field required to have the OOI to the desired position along with the necessary changes to the electromagnets to effect this movement. Typically, the magnetic drive module 120 induces movement of the OOI by altering the magnetic field to produce a gradient. If the gradient is large enough, the OOI will be induced to move to the position of minimal potential energy within the altered magnetic field. The theoretical position of the minimal potential energy location of the altered magnetic field is calculated by the measurement module 130 using data obtained from the magnetic flux sensors.

The magnetic drive module 120 then alters the magnetic field 220 based on these calculations by controlling the electromagnets accordingly.

The new position of the OOI is then determined 222 (in a real-time loop) such as by using similar methods as used to determine the OOI's original position in 214. In one embodiment, the measurement module 130 determines the position of the OOI. The position of the OOI can be with regard to any suitable reference frame, including the electromagnets of the magnetic drive module 120.

After determining the new location of the OOI, the expected position of the OOI is then determined 224. In one embodiment, this can be performed by obtaining the characteristics of the magnetic field after the OOI has moved. This data may be stored as the new magnetic field characteristics.

By comparing the two sets of magnetic field characteristics (before the OOI moved and after the OOI moved), the expected position of the OOI can be determined. Based on known algorithms, it can be determined where the OOI should be in relation to the change in the magnetic field between the expected position and the original position of the OOI.

The force information can then be calculated 228 by comparing the new location of the OOI with the expected position of the OOI. When there is a difference between the new position and the expected position of the OOI, the OOI has likely come in contact with a blockage or other object and is likely experiencing a force. Based on the difference in displacement between the new position and the expected position (which is preferably the location of minimal potential energy in the magnetic field), the force information can be calculated such as by using the force equation F=K (position(new)−position(expected)), where K is a mathematical function. In another embodiment, the measurement module 130 calculates the force on the OOI using the relationship between the difference in the new position and the expected position of the OOI. The expected position of the OOI is the location of minimal potential energy of the magnetic field that can be determined by the specifications of magnetic field source. These specifications can be established by pre-developed model of the magnetic field and/or real-time measurement of the produced magnetic flux.

As will be understood, by obtaining the force information, further calculations using this information may be performed such as, but not limited to, pressure information.

This force information may then be transmitted or communicated 230 back to the input device so that the user, such as a surgeon, may recognize that there is an object or blockage in the way and therefore will not accidentally puncture this blockage.

In another embodiment, after the force information is transmitted, the magnetic field characteristics after the OOI has moved may be stored as the current magnetic field characteristics so that information does not have to be obtained the next time the OOI is moved.

The benefit of providing more accurate force information allows the surgeon to more easily perform a medical procedure without possibly puncturing important internal organs, blockages or arteries which may not be visible on a display screen. The force information may also provide a more accurate tactile feel so that the surgeon can not only see visually (on a screen) but also feel by a tactile response the type of blockage that they may be facing with the OOI.

In an alternative embodiment, in order to determine mathematical relation (referred to as force equation) corresponding to the linear relationship between the difference in the new position and the expected position of the manipulable object 110 and the force experienced by the manipulable object 110, the measurement module 130 may need to be calibrated in advance such as the stiffness of the magnetic field K.

The calibration typically includes making repeated measurements of the force the manipulable object 110 is under when the magnetic drive module 120 alters the magnetic field to produce a magnetic flux gradient. The quantity of calibration force measurements will depend on the desired accuracy of the system, where more measurements will typically result in higher accuracy. The calibration procedure will likely only need to be undertaken once as long as the system parameters stay constant. If parameters change, such as an alteration of the manipulable object 110 or a coil replacement in the magnetic drive module 120, then another calibration may be required.

Figure 4:
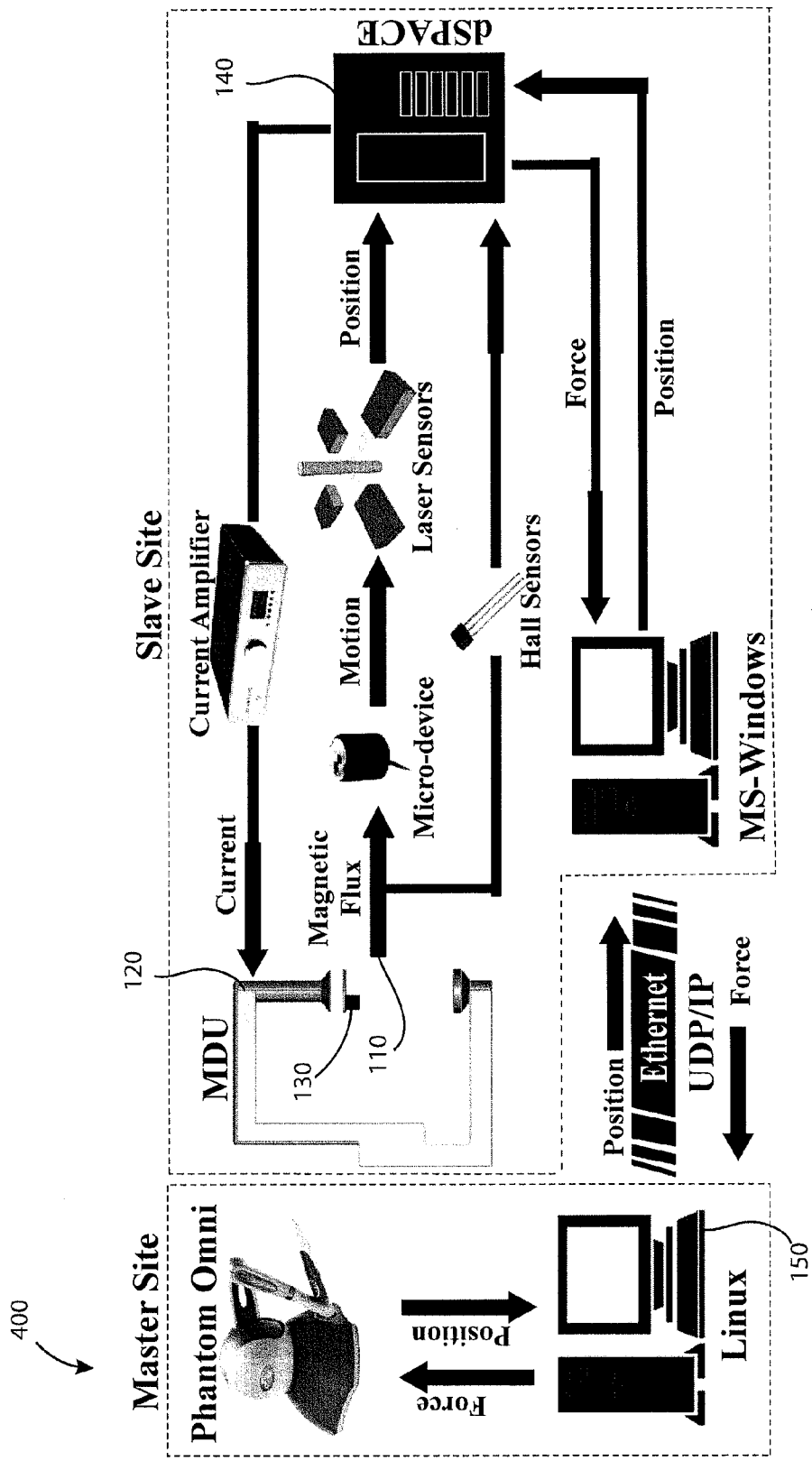
FIG. 4 illustrates a magnetically driven environment for providing force information according to an example embodiment.

In a specific example of use for the method and system of the disclosure, the system and method may be used for magnetic microrobot systems in biological and biomedical applications as schematically shown in FIG. 4. This setup was used for experimental testing and is used as an example only to reflect various findings. Such systems can be employed for cell/scaffold micromanipulations, cell injections, microsurgery, and micro-drug delivery. Untethered microrobotic systems can accommodate the on-board power supply limitations, the power required for the microrobot locomotion is transferred to the microrobot from a macro-domain power source.

FIG. 4 illustrates an example environment 400 for the magnetic microrobot system. The environment 400 for the magnetic microrobot system can include a haptic-enabled magnetic micromanipulation platform (HMMP). The HMMP may include three sub-parts: a magnetic untethered microrobot system (MUMS), a haptic phantom omni device (HPOD), and a scaled bilateral teleoperation system (SBTS).

In this example, the MUMS may include a magnetic drive unit (MDU) and a manipulable object 110. In this case, the manipulable object 110 (or object of interest) is a microrobot. The MDU can include a magnetic drive module 120 for producing and regulating the magnetic field and a measurement module 130 for performing measurements of the microrobot and the magnetic field. As well, the scaled bilateral teleoperation system (SBTS) can include a controller module 140 for communicating control commands and feedback with other parts of the environment 400. Further parts of the example environment 400 for the magnetic microrobot system will be described herein.

The MUMS uses magnetic-based propulsion technology to produce a bio-compatible environment. The HMMP utilizes a haptic interface as its master side that operates by a user (not shown). A bilateral macro-micro teleoperation technique has been employed for the telepresence of the user in the task's environment. The user can feel the hard contact (high stiffness environment) during tasks if the microrobot confronts a stiff environment. The magnetic microrobot system can also transfer the soft contact (small stiffness environment) feeling to the user. Thus, the applied force from the environment to microrobot is needed to be measured and then transferred to the user's hand.

The haptic-enabled magnetic micromanipulation platform (HMMP) may include two sites, a master and a slave, that can communicate with each other by analog and/or digital (such as Ethernet) connections. The Ethernet/UDP communication channel provides fast data transferring for this real-time system, and enables the user in the master site to remotely conduct a task in the slave site. Communication between the master site and the slave site is preferably via the Internet or any other suitable network.

The slave site includes the magnetic microrobotic station (MMS) and a scaled bilateral teleoperation system (SBTS). The MMS is a magnetic untethered microrobotic system (MUMS) that may include two main separated components: a magnetic drive unit (MDU) and a microrobot. The MDU produces and regulates the magnetic field for propelling the microrobot in a non-contact way. The MDU may be equipped with three high precision laser micrometers to determine the position of the microrobot in three axes. The HMMP's microrobot may include a magnetic head, a body that carries electronic parts, and an end-effector.

The bilateral macro-micro teleoperation technique may be employed in the STBS for the telepresence of a user in the micro-domain world. The SBTS implements macro-micro scaling for both position and force to make a micro-domain task more comfortable for the user. A gain-switching control scheme may be utilized as a strategy of the SBTS for the HMMP to improve the transparency of position-error-based teleoperation for two cases: 1) free motion, and 2) bump into a hard contact. However, the transparency and fidelity of the SBTS can be improved if the SBTS's controller is fed with the measurements slave-side force sensors. To measure the force, the force equation can be used.

The master site includes the haptic station. This station may include a haptic Phantom omni device (HPOD) and a server computer. The human operator can control the microrobot's position by moving the HPOD's stylus. In addition, the HPOD provides force-feedback to the human operator's hand. A Linux server computer is employed to communicate with the slave site. This server can send the position command from master site to slave site and also receives the calculated force-feedback from the slave site through analog and/or Ethernet/UDP.

The magnetic propulsion originates from the interaction of a magnetic material with the external magnetic field. Placing a permanent magnet with an inherent magnetization M in an external magnetic field B raises the total potential energy and proceeds a force exerted on the unit volume of a permanent magnet.

$$f = +\nabla(M \cdot B) \tag{1}$$

This external magnetic field also applies magnetic toque $\tau = M \times B$ to the unit volume of the permanent magnet. This magnetic torque tends to orient the permanent magnet parallel to the external magnetic field's vector. Therefore, the forces and torques experienced by the permanent magnet can be controlled by regulating the external magnetic field.

Figure 5B:
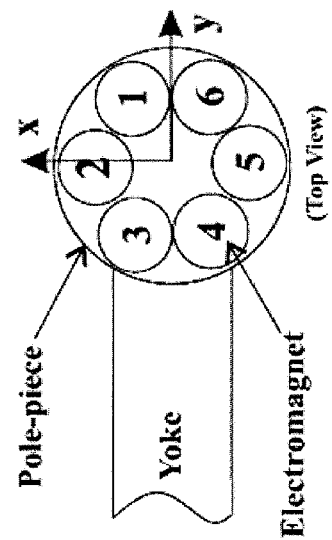
FIG. 5B illustrates a top view of a magnetic drive unit.
Figure 5A:
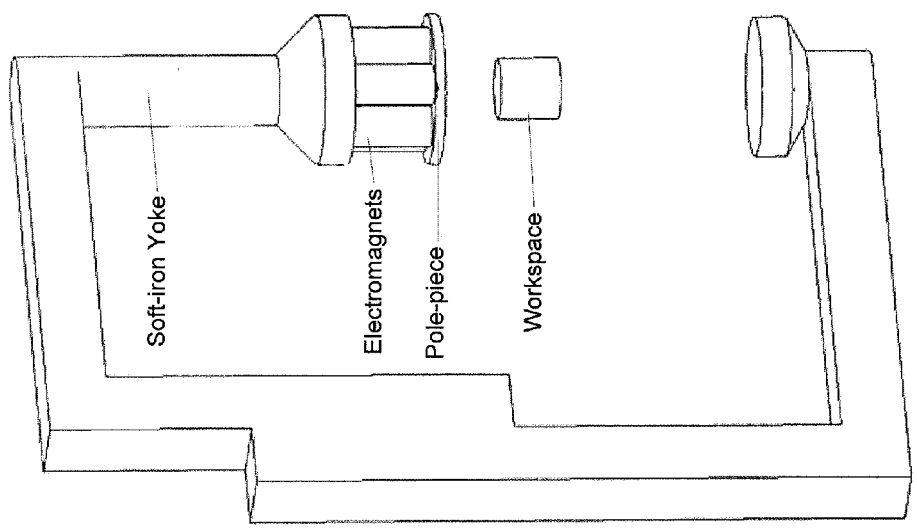
FIG. 5A illustrates a perspective view of a magnetic drive unit.

The magnetic untethered microrobotic system (MUMS) may be made up of two separated subsystems: a magnetic drive unit (MDU) and a microrobot. The drive unit is advanced to generate the magnetic field for propelling the microrobot in an enclosed environment, shown in FIGS. 5A and 5B schematically. The drive unit can include six-pairs of electromagnets, a disc pole-piece for connecting the magnetic poles, and a yoke. The maximum magnetic field in z-direction produced by the MDU is approximately in the range of 0.1-0.2 Tesla inside the workspace. The resolution of the generated magnetic field by MDU is approximately 0.19 μT.

The microrobot's head may be modeled with magnetization M as a single dipole permanent magnet, and it is assumed that M=[0 0 M]. Furthermore, for a small permanent magnet (PM), the magnetization can be taken as a constant and as uniformly distributed throughout the volume. Therefore, the induced magnetic force due to the external magnetic field can be represented by:

$$f = M(\nabla B_z) \quad (2)$$

Figures 6A, 6B:
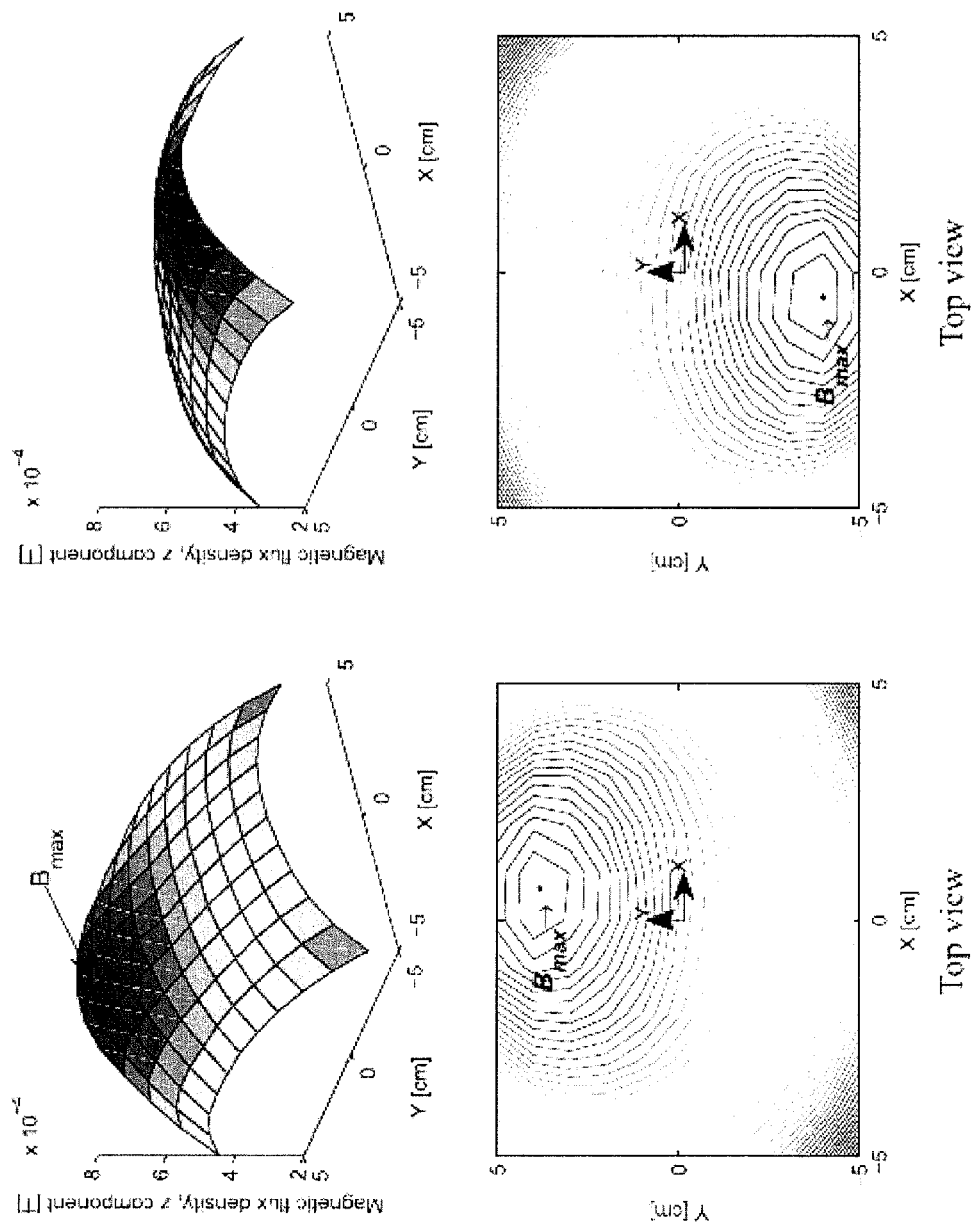
FIGS. 6A and 6B are charts illustrating changes in a magnetic field by variations of electromagnets.

This mathematical relation demonstrates the changes of magnetic force with the gradients of the z-component of the magnetic field. In theory, the permanent magnet placed in an external magnetic field is inclined to move toward the minimum total potential energy location, referred to as the $B_{max}$ point. Hence, the PM can be manipulated by regulating the gradients of B and controlling the $B_{max}$ location. FIGS. 6A and 6B demonstrate the changes of $B_{max}$ locations by the variations of the coils' currents of the electromagnets. This figure also represents the capability of the MDU in producing a unique $B_{max}$ location.

Figure 7:
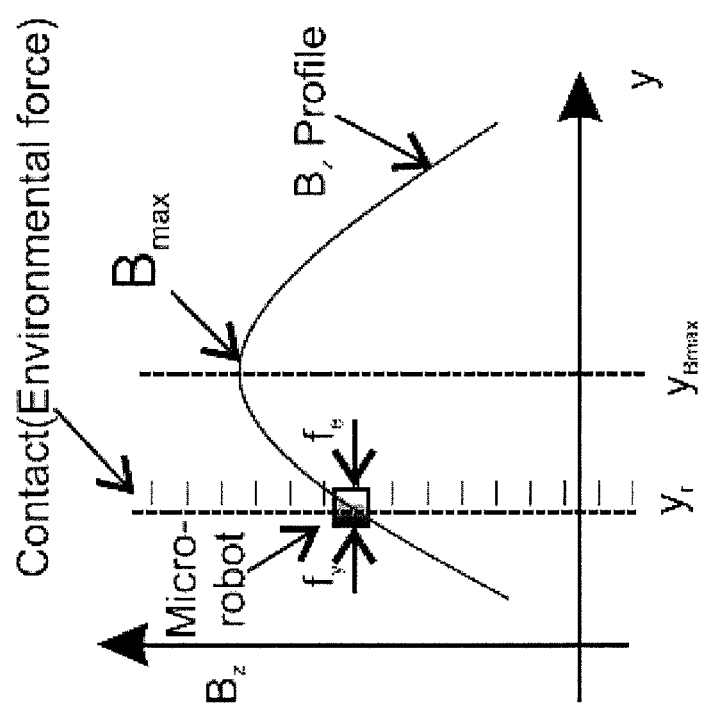
FIG. 7 is a chart illustrating robot location in a non-zero magnetic field gradient.

In a condition where the microrobot is in contact with an environment that applies force ($f_e$) to the microrobot, the microrobot is not stabilized at the $B_{max}$ location. The magnetic field produced by the MDU exerts force to the microrobot to move it toward the $B_{max}$ location, meanwhile the environment applies equal and opposite direction force ($f_e$) to the microrobot. Thus, the microrobot becomes stable at a location that the magnetic field gradient is not equal to zero in the horizontal motion plane, shown schematically in FIG. 7. The environmental force measurement can also be examined in the x- and z-directions. In the steady state condition, the magnetic force applies to the microrobot equals to the environmental force. The microrobot real position can be represented as $y_r = y_{Bmax} + \Delta y$, as shown in FIG. 7. The force relation can then be calculated as $f_e = f_y(y_{Bmax} + \Delta y)$. Depending on the $f_y$ relation with respect to y, it could be defined as a linear or non-linear relation based on the specifications of the magnetic field source. Assuming a linear function for the $f_y$ relation with respect to y, the force relation can be then be as $$f_e = f_y(y_{Bmax} + \Delta y) = \overbrace{f_y(y_{Bmax})}^{=0} + f_y(\Delta y) = K\Delta y$$

This equation demonstrates that the magnetic force applies to the microrobot is proportional to the distance of the microrobot from the $B_{max}$ location. In case of non-linear relation for $f_y$, a more complex stiffness of magnetic field (K) can also be derived. Thus, by determining the $B_{max}$ location and the stiffness of magnetic field (K) the environmental force in the steady-state condition can be estimated.

The microrobot's position can be determined by measuring the magnetic flux produced by the MDU. The position of the $B_{max}$ can be controlled by tuning the electromagnets' produced magnetic fluxes [changing the electromagnets' coil current alters produced magnetic flux]. Thus, the $B_{max}$'s shifts take place by the produced magnetic flux. If the relation is reversed, the $B_{max}$ position can be estimated by measuring the magnetic flux. This reverse concept can be employed to determine the $B_{max}$ location.

Figure 8:
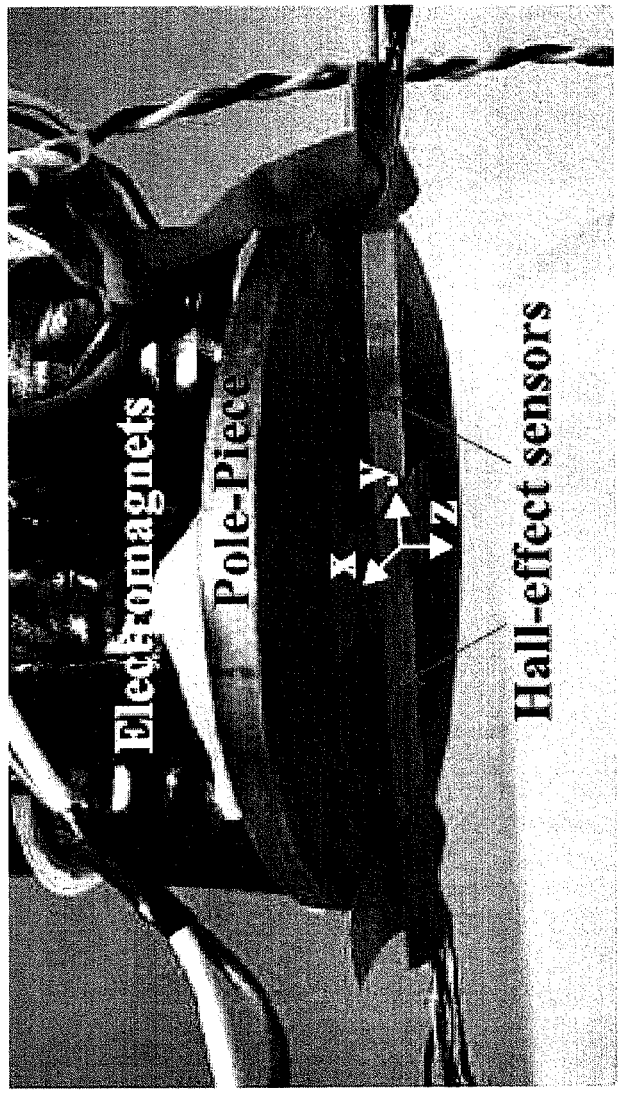
FIG. 8 illustrates a perspective view of electromagnets and magnetic field sensors.

A combination of Hall-effect sensors may be installed on the MDU's structure to measure the magnetic flux. Since the generated magnetic flux of electromagnets penetrates to the MMS's workspace through the pole-piece, Hall-effect sensors may be attached to the pole-piece to measure the produced magnetic flux. In order to estimate the $B_{max}$ position in one axis, it is found that at least two hall sensors should be installed on the specified axis on the pole-piece. The difference of magnetic flux measured by these two sensors can be mapped to the $B_{max}$ position. FIG. 8 illustrates the two Hall-effect sensors in the y-direction attached to the pole-piece.

Figure 9:
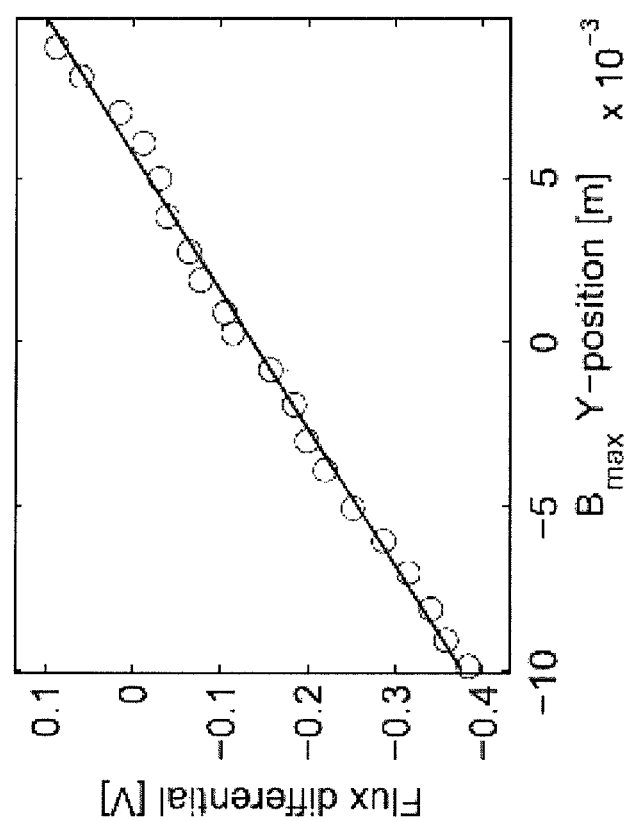
FIG. 9 is a chart illustrating measured flux differential versus robot position.

The MDU can been used to manipulate the microrobot along the y-axis; meanwhile the magnetic flux is measured by the Hall-effect sensors and is recorded. FIG. 9 illustrates the measured flux differential versus the microrobot's position on the y-direction. FIG. 9 also shows the best fitted curves to experimental measurements as:

$$y_{Bmax} = 0.044 v_d + 0.0069 \quad (3)$$

Where $v_d$ is the flux differential in voltage measured by the Hall-effect sensors ("Two hall sensors" outputs have been amplified via operational amplifier). Depending on the magnetic field source and the location of the Hall-effect sensors, more complex and accurate mathematical relation could be established.

Figure 10:
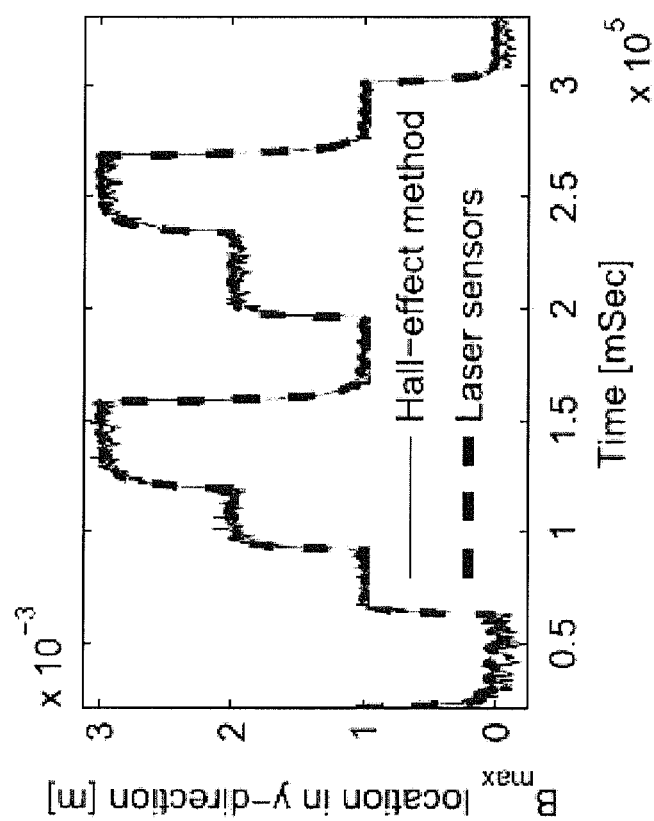
FIG. 10 is a chart illustrating estimation of a minimum potential energy location.

The performance of Hall-effect based $B_{max}$ location estimation method in y-axis has been illustrated in FIG. 10. As shown in FIG. 10, the Hall-effect sensors measurements coupled with the mathematical relation provides accurate position estimation of the $B_{max}$ position.

Figure 11:
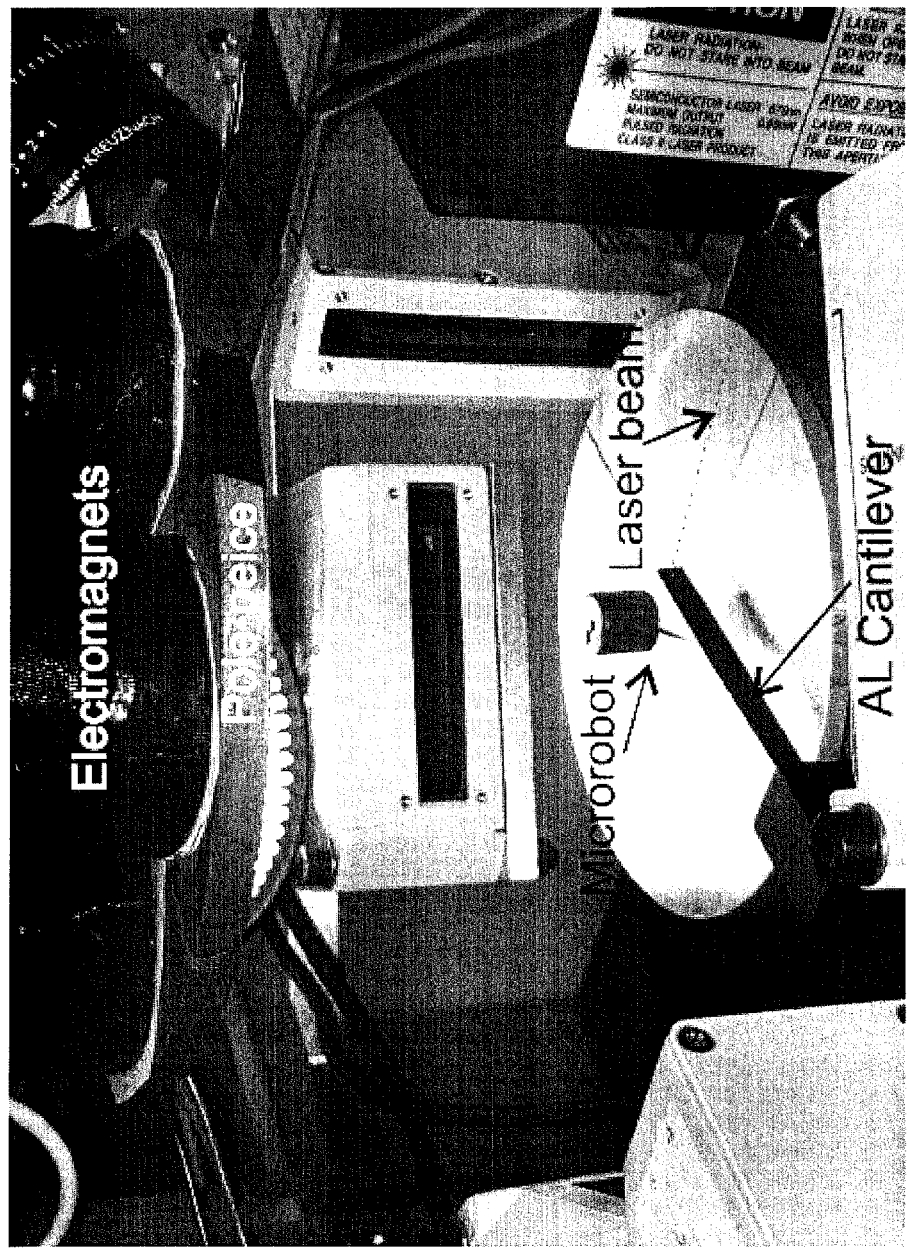
FIG. 11 is a perspective view of a force calibration arrangement.
Figure 13B:
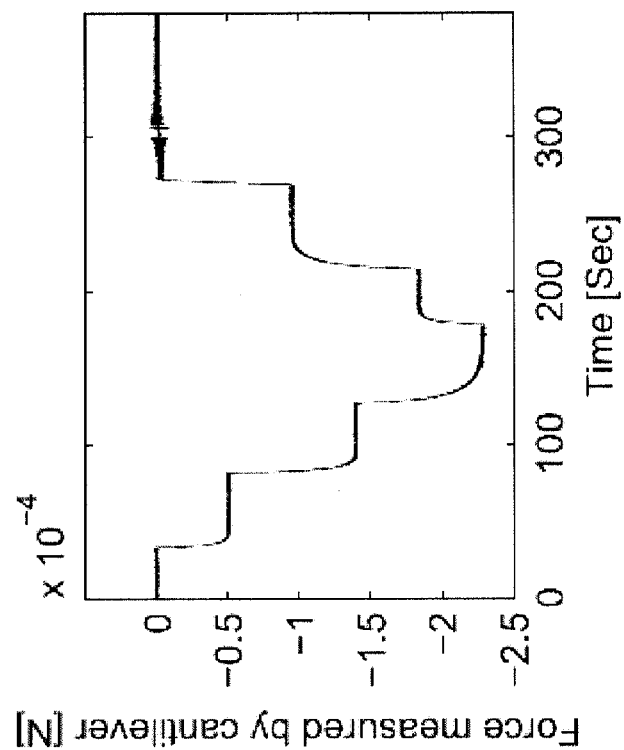
FIGS. 13A and 13B are charts illustrating deflection and measured force from force calibration.
Figure 13A:
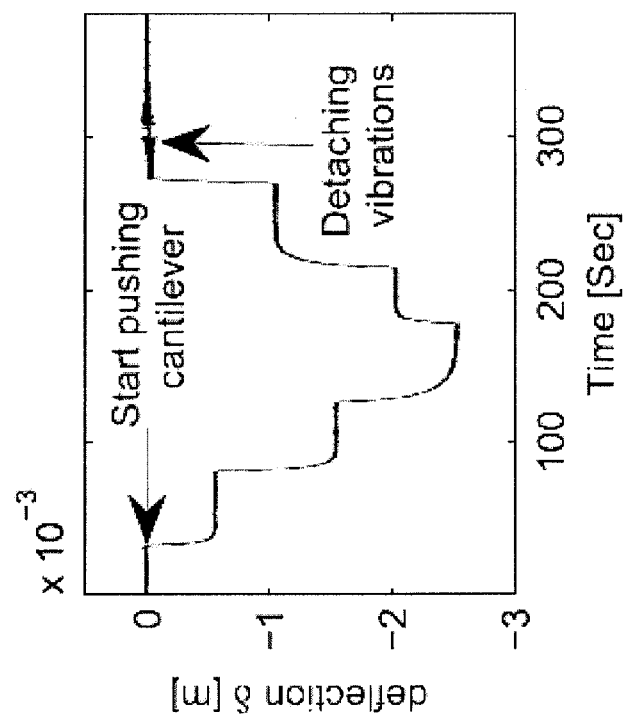

Replacing the $B_{max}$ location in the force model relation results in the following derivation of the force:

$$f_y = f_e = C\Delta_y = K(y_r + y_{Bmax}) = k_r y_r + k_v v_d + k_0 \quad (4)$$

Where $k_r$, $k_v$, and $k_0$ are coefficients that can be determined by a series of experimental measurements. These coefficients can be determined by defining at least three equations. Depending on the number of calibration points as:

$$\begin{bmatrix} k_r \\ k_v \\ k_0 \end{bmatrix} = \begin{bmatrix} y_{r_1} & v_{d_1} & 1 \\ y_{r_2} & v_{d_2} & 1 \\ \vdots & \vdots & 1 \\ y_{r_{n-1}} & v_{d_{n-1}} & 1 \\ y_{r_n} & v_{d_n} & 1 \end{bmatrix}^{\dagger} + \begin{bmatrix} f_{y_1} \\ f_{y_2} \\ \vdots \\ f_{y_{n-1}} \\ f_{y_n} \end{bmatrix} \quad (5)$$

Where the subscript i denotes the number of the calibration point, and † is the generalized inverse or pseudo-inverse operation of a matrix. In one method to obtain calibration points, a high precision force measurement setup has been designed based on the tip deflection of a cantilever. FIG. 11 illustrates the arrangement of the cantilever. The microrobot used for this study includes a cylindrical permanent magnet, the radius of 5 mm and the height of 10 mm, as the head of the microrobot with a needle-base end-effector. The weight of this microrobot is 11 gr. The aluminum cantilever is 50×5×0.05 mm³ and made by Aluminum alloy 1100. The laser sensor measures the tip deflection of the cantilever with the accuracy. The force applied to the tip of the cantilever can be obtained by:

$$P = \frac{3EI\delta}{l^3} \quad (6)$$

Where E, I, l, and δ are modulus of elasticity, area moment of inertia, length, and elastic deflection, respectively. The accuracy analyses demonstrated that the cantilever-based force measurement method provides the error of less than 0.64 μN in measuring the applied force to the cantilever's tip. However, this error can be reduced by increasing the accuracy of deflection measurement and physical properties of the cantilever. In the experimental measurement, the cantilever is placed with zero distance from the microrobot, and the microrobot is then commanded toward the cantilever's tip in several steps and then moved backward to detach from the cantilever's tip. As shown in FIG. 12A, the microrobot starts pushing moderately the cantilever's tip at the time of 32.3 second by increasing the magnetic flux differential [the flux differential changes in voltage ($v_d$) versus the real position of the microrobot ($y_r$) is presented in FIG. 12B], and the deflection measurement records first displacement of the cantilever's tip at time of the 32.7 second. The microrobot is detached form the cantilever's tip at the time 321 second, since the microrobot is commanded to move to the position −0.5 mm. Although the releasing process has softly taken place, a small vibration occurs in the cantilever as seen in FIGS. 13A and B which presents the deflection of the cantilever's tip and the measured force Eq. 6, respectively.

Figure 14:
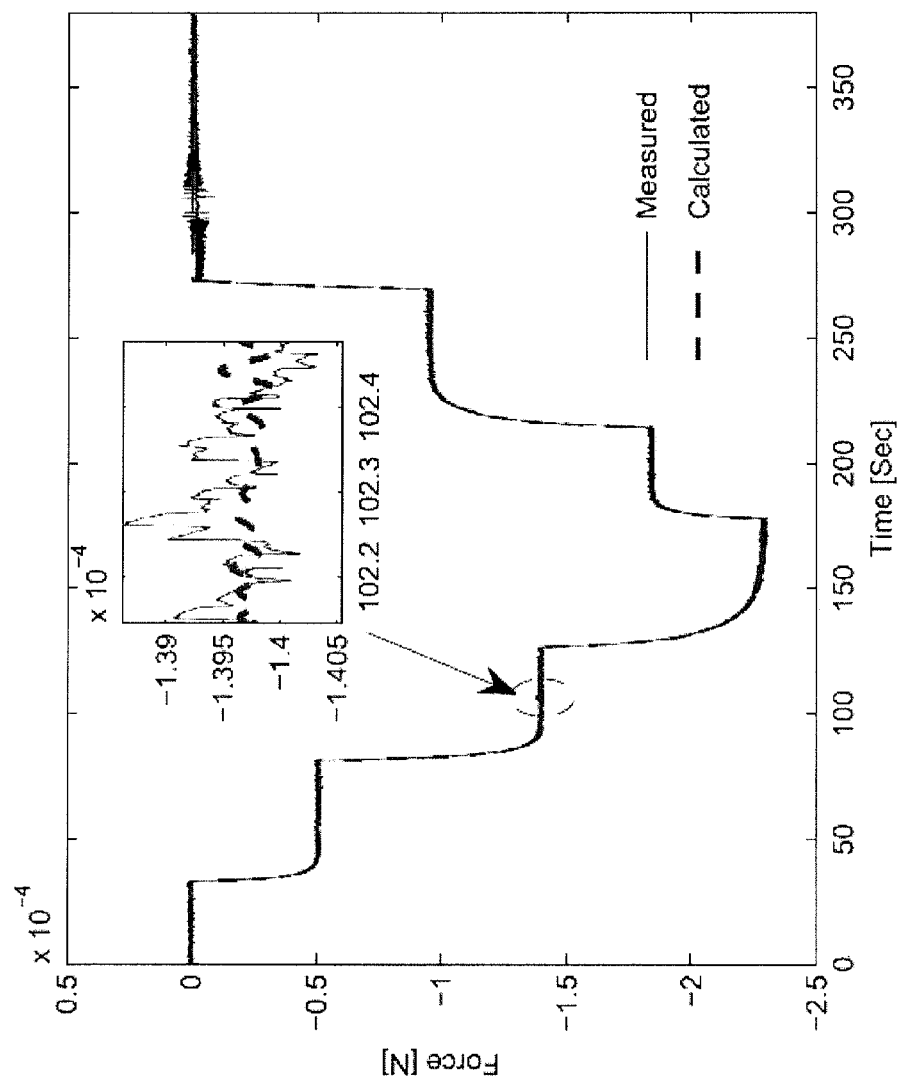
FIG. 14 is a chart illustrating a comparison of two force measurement methods.

To calculate the force by using Eq. 4, the flux differential in voltage and the real position of the microrobot are instantaneously recorded during the experimental measurements, illustrated by FIG. 12B. The force applied to the cantilever's tip can be calculated by the Hall-effect sensors method by replacing the derived coefficients in Eq. 5 shown in FIG. 14 the comparison of the two force measurement methods: measuring the deflection of the cantilever and the Hall-effect-based measurement. As shown in this figure, the Hall-effect-based method can accurately estimate the deflection force. To validate the performance of Hall-effect-based method corresponding to the cantilever-based technique, the root-mean-square (RMS) of the force error, calculated force obtained by Hall-effect-based method minus the measure force obtained by the cantilever-based technique, has been calculated as 0.63 μN. Thus, the non-contact force estimation technique, Hall-effect-based method, provides high accuracy relative to the measured force by the cantilever-based routine. Since the cantilever-based technique has the accuracy of 0.64 μN, the accuracy of Hall-effect-based method can be calculated as 1.27 μN.

Figure 15:
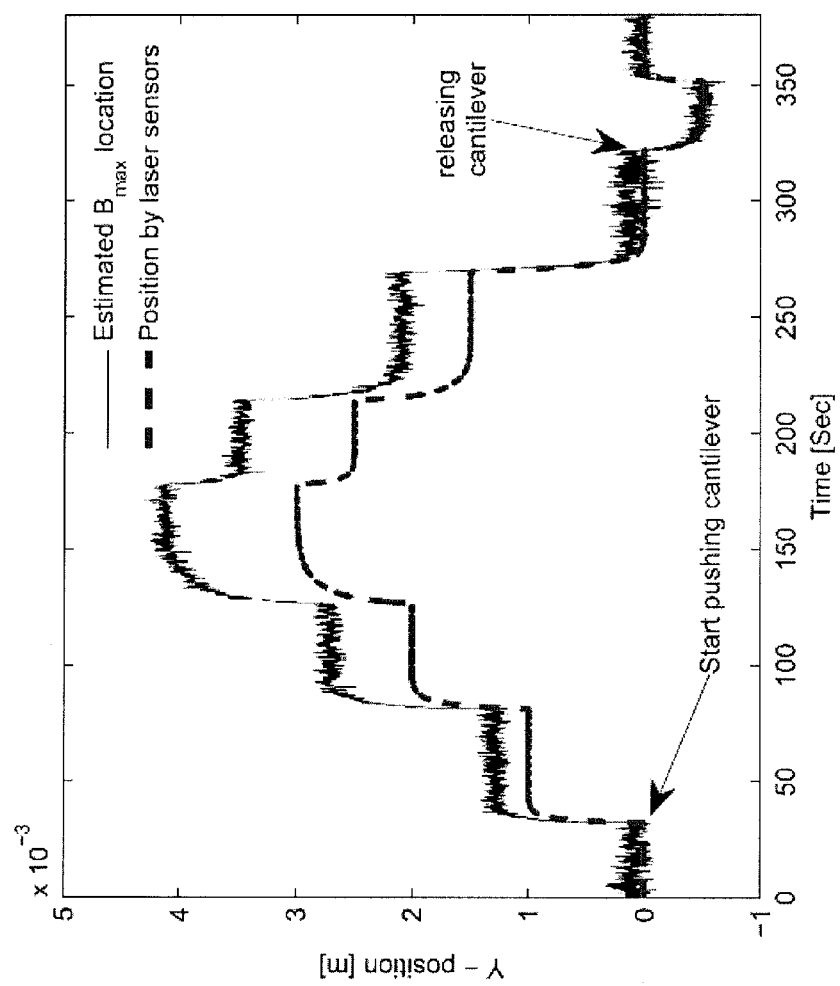
FIG. 15 is a chart illustrating the change of minimum potential energy location versus a robot's actual position.
Figure 16:
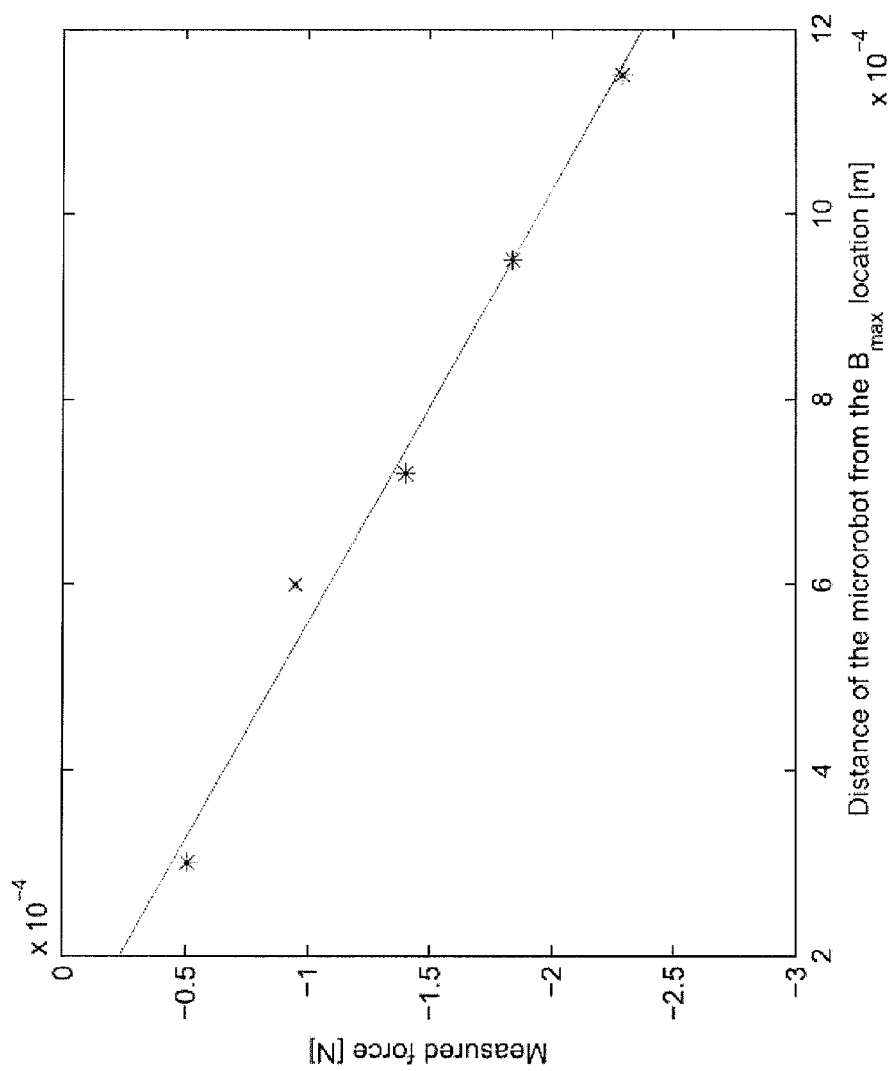
FIG. 16 is a chart illustrating the linear relation of applied force to a robot and the robot's change in position.

The concept of Hall-effect-based force measurement is based on the distance of real position of the microrobot and the estimated $B_{max}$ location, FIG. 15 illustrates the change of $B_{max}$ location versus the microrobot's real position, when the microrobot pushes the cantilever. By increasing the cantilever's deflection, the distance of the microrobot's position from the $B_{max}$ location may become larger. As shown, when the microrobot is in contact with cantilever, there is discrepancy between the microrobot's position and the estimated $B_{max}$ location, and whenever the microrobot is detached from the cantilever, the microrobot's position and the estimated $B_{max}$ are very close to each other. FIG. 16 illustrates the linear relation of applied force to the microrobot by measuring the distance of the microrobot from the estimated $B_{max}$.

In a further case, the HMMP may include a micro magnetically levitated slave robot and a macro-master haptic robot. The HMMP enables a user to control the micro slave robot by maneuvering the macro-master haptic robot. To enable the user the feeling of a micro-domain task, the micro-domain force estimation method is used to measure the environmental force in a single-axis direction. This method uses magnetic flux measurement and the microrobot's position information to calculate the environmental force. No force sensor is attached to the microrobot to measure the force, which may reduce the microrobot's size, may make the microrobot inexpensive, and may allow the microrobot to be disposable for biological applications.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of determining force experienced by an object of interest (OOI) from its surrounding environment in a magnetic field comprising:
   altering the magnetic field to move the OOI toward an expected position; and
   calculating the force information associated with the force experienced by the OOI based on sensors associated with measuring the magnetic field;
   wherein calculating the force information includes:
   determining a new position of the OOI within the magnetic field; and
   comparing the new position with the expected position of the OOI; and wherein the force information includes magnetic flux measurements.

2. The method of claim 1 further comprising, before altering the magnetic field:
   calculating a required magnetic field to perform the altering.

3. The method of claim 1 further comprising:
   transmitting the force information to a user.

4. The method of claim 3 wherein transmitting the force information comprises:
   transmitting the force information as a tactile feedback.

5. The method of claim 1 wherein determining the new position comprises:
   measuring the new position using laser micrometers, optical micrometers, infrared micrometers, fiber optic sensors, capacitance sensors, x-ray radiography, sonar, ultrasound, magnetic resonance imaging, thermography or computed tomography.

6. The method of claim 1 wherein the sensors are located remote from the OOI.

7. The method of claim 1 wherein the sensors are Hall-effect sensors.

8. The method of claim 1 further comprising, before altering,
   receiving request for movement of the OOI within the magnetic field.

9. The method of claim 1 wherein calculating the force information further comprises:
   determining an expected position of the OOI.

10. A non-transitory computer-readable medium for determining force experienced by an object of interest (OOI) from its surrounding environment in a magnetic field, comprising instructions stored thereon, that when executed on a processor, perform the steps of:
    altering the magnetic field to move the OOI toward an expected position; and
    calculating the force information associated with the force experienced by the OOI based on sensors associated with measuring the magnetic field;
    wherein calculating the force information includes:
       determining a new position of the OOI within the magnetic field; and
       comparing the new position with the expected position of the OOI; and
    wherein the force information includes magnetic flux measurements.

11. The non-transitory computer-readable medium of claim 10 wherein the method further comprises:
    transmitting the force information to a user.

12. The non-transitory computer-readable medium of claim 11 wherein transmitting the force information comprises:
    transmitting the force information as a tactile feedback.

13. The non-transitory computer readable medium of claim 10 further comprising, before altering,
    receiving request for movement of the OOI within the magnetic field.

14. The non-transitory computer-readable medium of claim 13 wherein the method further comprises, after receiving request for movement:
    moving the OOI to an expected position.

15. The non-transitory computer-readable medium of claim 14 further comprising, before altering the magnetic field:
    calculating a required magnetic field to perform the altering.

* * * * *